United States Patent [19]
Grenon

[11] 4,251,327
[45] Feb. 17, 1981

[54] ELECTROPLATING METHOD

[75] Inventor: Lawrence A. Grenon, Phoenix, Ariz.

[73] Assignee: Motorola, Inc., Schaumburg, Ill.

[21] Appl. No.: 111,617

[22] Filed: Jan. 14, 1980

Related U.S. Application Data

[63] Continuation-in-part of Ser. No. 17,203, Mar. 2, 1979, abandoned.

[51] Int. Cl.³ .......................... C25D 5/02; H01L 31/18
[52] U.S. Cl. .................................... 204/15; 204/38 B; 204/DIG. 3; 136/256
[58] Field of Search ................. 204/15, 38 B, DIG. 3; 136/89 CC

[56]     References Cited
U.S. PATENT DOCUMENTS 4,144,139   3/1979   Durkee .................................... 204/15

OTHER PUBLICATIONS

M. G. Coleman et al, "The Pd₂Si-(Pd)-Ni Solder Plated Metallization System For Silicon Solar Cells", *Conf. Record, 13th IEEE Photovoltaic Specialists Conf.*, Jun. 1978, pp. 597-602.

*Primary Examiner*—T. Tung
*Assistant Examiner*—William Leader
*Attorney, Agent, or Firm*—John A. Fisher

[57]     ABSTRACT

A method for electroplating a metallic layer onto the surface of a photovoltaic device absent any external electrical contacts to the surface. The photovoltaic device is placed in an electrolytic plating bath where it is illuminated with electromagnetic radiation to which the device is photovoltaically responsive. Plating from the electrolytic bath results from current flow generated in the device itself.

12 Claims, 3 Drawing Figures

ELECTROPLATING METHOD

RELATED APPLICATIONS

This is a continuation-in-part of application Ser. No. 017,203, filed Mar. 2, 1979, now abandoned.

BACKGROUND OF THE INVENTION

This invention relates to a method for electroplating, and more particularly to a method for electroplating a metallic layer onto a surface of a photovoltaic device absent any external electrical contact to the surface.

Photovoltaic devices, and more particularly solar cells, often consist of a semiconductor wafer which forms a single large PN junction. Electromagnetic radiation such as sunlight incident upon that junction produces electrical carriers in the device and generates an electrical current. To be useful, that current must be collected and conveyed to an external circuit. The collecting is accomplished by metallic patterns which are in ohmic contact with the two sides of the PN junction. Because the photovoltaic device generates high currents at a very low voltage (essentially the forward voltage of the PN junction) it is necessary that the metallic pattern provide a low resistance path to minimize resistive losses of the generated current. The metallic pattern must be limited in its physical extent, however, especially on the front surface of the device, in order to minimize the amount of incident radiant energy intercepted by the metal and thus lost for current generation purposes. In sum, this requires that the front metallic pattern consist of narrow strips of very highly conductive material. The requirement is exacerbated in so-called concentrator cells upon which the incident radiation is concentrated and can be many times higher than the normal incident radiation. Because the generated current is roughly proportional to the incident radiation, this can result in very high current densities and the need for a very low resistance metallic pattern.

In fabricating a flat plate silicon solar cell designed for one sun operation, a satisfactory metal pattern can be achieved by applying a thin patterned layer of an ohmic contact and barrier layer material and by subsequent solder dipping. The solder dipping provides a thick conductor of low enough resistance for many applications. The solder itself, however, is not of low enough resistance to be satisfactory for concentrator cells. A more highly conductive material such as silver or copper is needed. Heretofore, however, there have not been any satisfactory, economical, efficient processes for providing thick layers of the desired high conductivity materials. Vacuum processes such as sputtering or filament evaporation are too time consuming and expensive. Electroless plating is unsatisfactory because there is no satisfactory electroless bath for the plating of either silver or copper. In addition, all of the conventional electrolytic techniques have severe drawbacks. For example, to plate a thick layer of silver onto the thin ohmic contact and barrier layer material, electrical contact must be made to that material which then functions as one of the electrodes of the plating reaction. If contact is made to the material at a single location or at a finite number of discrete locations, however, there will be a large resistance drop from that contact or contacts to the distant portions of the metal pattern. This high resistance results from the normally high resistivity of the thin layer of material. As the plating starts, this resistance causes distant portions of the metal pattern to be at a lower potential than those portions of the pattern adjacent contacts. This causes the plated layer to be very non-uniform in thickness since the rate of plating is proportional to the applied voltage which establishes a plating current density associated with a particular applied voltage. One possible solution to this problem is to plate very slowly at very low plating currents. Because the current is low, the ohmic drops are low and potential variations across the wafer can at least be minimized. This solution is not economically acceptable, however, because the plating is too slow. The problems encountered in electrolytic plating become even more pronounced when one tries to simultaneously plate onto both sides of the semiconductor wafer, whether the back metallization is patterned or not.

Accordingly, it is an object of this invention to provide an improved electroplating method which overcomes the limitations inherent in prior art methods.

It is a further object of this invention to provide a method for the uniform plating of metallic layers onto both major surfaces of a device.

BRIEF SUMMARY OF THE INVENTION

One embodiment of this invention provides a method for electroplating a metallic layer onto a photovoltaic device absent any external electrical contacts to that device. The method comprises placing the photovoltaic device in an electrolytic plating bath and illuminating the device with radiant energy to which the device is photovoltaically responsive. Current generation in the device responsive to the illuminating radiation provides a uniform flow of current which in turn causes the electroplating of a uniform metal layer. In another embodiment of the invention the electrolytic deposition of a metal layer can be further improved by electrically contacting one surface of the device and applying a voltage thereto while simultaneously illuminating the opposite surface of the device with a source of radiant energy. This embodiment provides for the simultaneous and uniform plating on both surfaces of the device.

BRIEF DESCRIPTION OF THE DRAWINGS

The above stated objects as well as other objects and advantages of the invention will become more apparent upon consideration of the following detailed description of the invention taken in connection with the drawings in which.

DETAILED DESCRIPTION OF THE INVENTION

Figure 1:
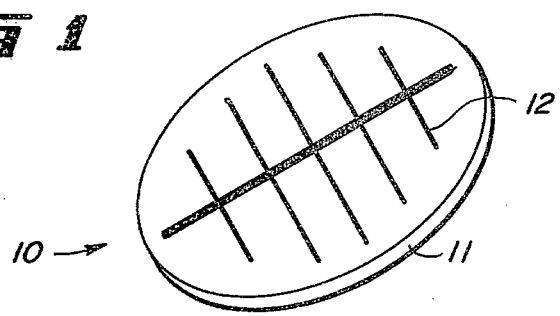
FIG. 1 shows a representative photovoltaic device wafer.

FIG. 1 shows a representative photovoltaic device 10 which might be, for example, a silicon solar cell. The solar cell is a 75 millimeter diameter silicon wafer 11 having a single large PN junction therein. Both sides of the junction are metallized, with a metallic pattern 12 making ohmic contact to the front side of the wafer. The metal pattern, representative of a large number of possible patterns, is designed to provide a low resistance path for collecting current generated at any location on the surface of the cell and, simultaneously, to minimize the amount of incident radiation intercepted by the metal and thus lost for current generating purposes.

In fabricating solar cell 10, the silicon wafer is diffused or ion implanted to form the PN junction, and the upper surface is covered with an anti-reflective coating such as silicon nitride or other insulator material. An aperture is then etched in the coating material in the shape of the desired metal pattern. This aperture provides a means for electrically contacting the surface of one side of the PN junction. The process is continued by the conventional immersion plating of a thin layer of palladium on the wafer and through the aperture. About 50 Angstroms of palladium is plated in this step. By the nature of the plating of palladium on such a substrate, the palladium plates only on the exposed silicon, not on the silicon nitride. The wafer is then sintered at about 300° C. for fifteen minutes in a nitrogen ambient to form a palladium silicide. The formation of the silicide ensures a good ohmic contact to the exposed silicon surface. Following the sintering step, an additional layer of about 300 Angstroms of palladium is plated on the wafer by conventional electroless plating and subsequently sintered in the same manner as the previous layer. This layer of palladium forms a barrier layer to prevent the migration of subsequent metals to the silicon where they might adversely affect the minority carrier lifetime of the cell or otherwise degrade the cell performance. Other materials such as platinum can be used for forming the silicide and other materials such as nickel or chromium can be used as the barrier metal.

Figure 2:
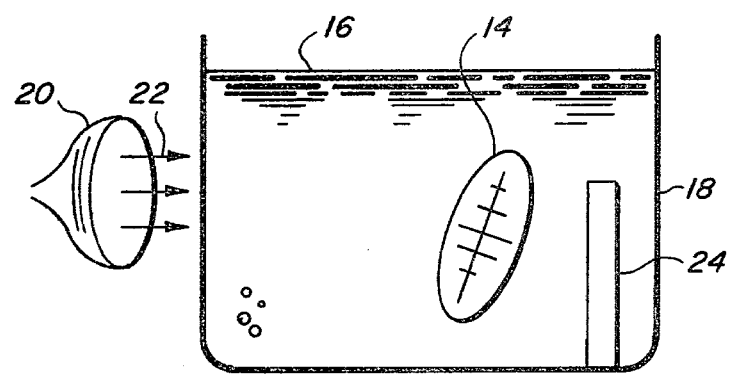
FIG. 2 schematically depicts an arrangement for implementing the invention.

Thus prepared with palladium layers, the wafer is ready to be plated with a thick layer of silver to reduce the resistance along the metal pattern. FIG. 2 schematically depicts a setup for plating the silver in accordance with the invention. The wafer 14, prepared as described above, is submerged in a plating bath 16. The bath is a conventional electrolytic silver plating bath, such as an aqueous silver-potassium-cyanide solution. Bath 16 is contained in a suitable container 18. A source of radiant energy 20 is positioned to illuminate wafer 14 with radiant energy generally indicated by the numeral 22. If wafer 14 is a silicon solar cell, radiant energy source 20 can be, for example, a quartz-halogen lamp which provides energy similar to that of the solar spectrum to which the silicon solar cell is photovoltaically sensitive. The radiant energy can be either continuous or pulsed. Container 18 must be of such a material as to be chemically inert with respect to the bath 16 and must also be transparent to radiant energy 22. Alternatively, the wafer can be positioned horizontally in container 18 and illuminated from above the bath. Container 18 then need not be transparent. For plating silver on a single silicon wafer 14 as shown, a quartz beaker is a suitable container 18. A silver sheet 24 dissolves in the bath and keeps the bath saturated with silver as the plating proceeds. The plating is accomplished by supplying power to the energy source 20 and allowing radiant energy 22 to impinge on the wafer. The impinging radiant energy generates a current in the solar cell. The rate of plating is a function of the intensity of the radiation incident on the wafer since the generated current is proportional to the incident intensity. For optimum plating results, the intensity should be adjusted to deposit approximately 3 micrometers of silver in one minute. If the plating is done at a significantly faster rate, the silver does not adhere well and tends to peel off. Plating at a significantly lower rate provides a high quality film, but is too expensive because of the time involved. A silver layer of 5–25 micrometers thickness is generally desired for a concentrator cell, with the exact thickness dependent on the application, cell size, pattern geometry and the like.

Figure 3:
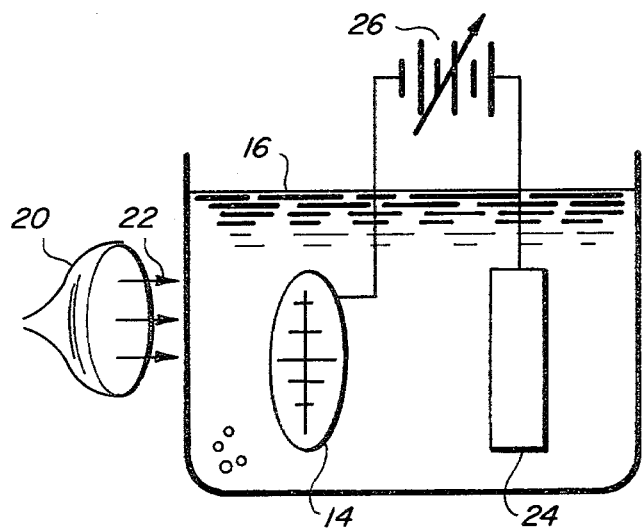
FIG. 3 schematically depicts an arrangement for carrying out a further embodiment of the invention.

FIG. 3 shows an alternate setup for practicing a further embodiment of the invention. This further embodiment provides for the deposition of more uniform layers on the front of the wafer and for the simultaneous plating of uniform layers on the back of the wafer. The layer on the wafer back can be coextensive with the whole back or can be patterned, as desired. In either case, the back surface can be prepared the same as the front with layers of palladium silicide and palladium. A DC electrical power supply 26 is connected between the silver electrode 24 and the back surface of wafer 14. The positive terminal of supply 26 contacts silver electrode 24 and the negative terminal contacts the back, or P side of wafer 14. By now illuminating the front of wafer 14 and by supplying a bias from power supply 26, plating simultaneously occurs on the front and back of wafer 14. The rate of plating on the front and back surfaces are independently controllable by adjusting the light intensity and the external current, respectively. The light intensity is optimized as described above. The illumination can be either continuous or pulsed. Pulsed illumination can be achieved, for example, by interrupting the light with a mechanical chopper. Optimum plating on the back of the wafer is achieved with an external bias which produces an external bias current of between 0.5 and 1.5 amperes. The external bias can likewise be continuous or pulsed. This current requirement is for a representative 75 millimeter diameter solar cell and must be scaled appropriately for cells of different size or for a plurality of cells. If the front of the cell is illuminated and the external bias is reduced to about 50 milliamperes or less, the plating continues normally on the front surface but no plating occurs on the back of the wafer. Front illumination improves the uniformity of the back plating and overcomes all of the difficulties associated with ohmic drops through the palladium layer to points distant from the electrical contact.

The processes have been described with particular reference to the plating of a layer of silver. The technique works equally well for plating other materials such as copper or mixtures of tin and nickel. The copper can be plated from an aqueous bath of copper potassium cyanide. The mixtures of tin and nickel can be plated from an aqueous bath comprising stannous chloride, nickel chloride, ammonium hydroxide, and ammonium fluoride. The tin nickel mixtures have found usage as an environmentally inert cap over other metal layers. With each of these deposited metals it is necessary to determine the optimum plating rate. To a large extent this will be dependent on the underlying surface.

The above-described embodiments have been described with respect to silicon solar cells, but the invention is not to be construed to such a limited usage. Photovoltaic devices fabricated from materials other than silicon can also be used, with appropriate changes where necessary, for example, in the source of radiant energy employed. The process does not work, however, in the absence of a photovoltaically responsive device. Placing a plain silicon wafer having no PN junction in the apparatus of either FIG. 2 or FIG. 3 does not result in plating on the illuminated surface.

Thus it is apparent that there has been provided, in accordance with the invention, an improved electrolytic plating method that fully satisfies the objects and advantages set forth above. While the invention has been described in conjunction with specific embodiments thereof, it is evident that many alternatives and modifications will be apparent to those skilled in the art in light of the foregoing descriptions and variations noted. Accordingly, it is intended to embrace all such alternatives and modifications as fall within the spirit and scope of the appended claims.

I claim:

1. An improved method for the electrolytic deposition of metal onto major surfaces of a PN junction photovoltaic device, one of said surfaces being of a first conductivity type and at least a portion of a second of said surfaces being of opposite conductivity type, said device being immersed in a plating bath containing ions of said metal to be deposited, which comprises the steps of: electrically contacting said surface of a first conductivity type; immersing an anode in said plating bath and applying a voltage between said first conductivity type surface and said anode, thereby completing a circuit through said bath; and illuminating said portion of said second of said surfaces of opposite conductivity type with a source of radiant energy.

2. The improved method of claim 1 wherein said source of radiant energy is a pulsed source.

3. A method for applying metal to the two major surfaces of a PN junction silicon solar cell having an antireflective coating overlying a first of said major surfaces, said first major surface doped to a first conductivity type, portions of said first major surface exposed through apertures in said antireflective coating, and having a second major surface doped to a second conductivity type, said method comprising the steps of: applying a layer of metal silicide forming material to said second of said major surfaces and to said portions of said first major surface; heating to form a metal silicide in contact with said solar cell; applying a barrier layer metal overlying said metal silicide; providing an electrolytic plating bath containing ions of the metal to be plated; immersing said solar cell in said electrolytic plating bath; illuminating said first surface of said solar cell with a source of radiant energy to which said solar cell is photovoltaically responsive; electrically contacting said second surface of said solar cell; immersing an anode in said bath and applying a voltage between said second surface and said anode, thereby to complete an electrical circuit and adjusting said voltage and the intensity of said source of radiant energy to independently control the rate of plating on said major surfaces.

4. The method of claim 3 wherein said metal silicide forming material is selected from the group consisting of palladium and platinum.

5. The method of claim 3 wherein said step of applying a barrier layer metal comprises the electroless plating of a layer of palladium.

6. The method of claim 3 wherein said metal to be plated is selected from the group consisting of silver, copper, and mixtures of tin and nickel.

7. The method of claim 3 wherein said source of radiant energy is a pulsed source.

8. The method of claim 3 wherein said source of radiant energy is a continuous source.

9. A method for the electrolytic deposition of metal onto major surfaces of a PN junction photovoltaic device having a P-type first surface and an N-type second surface which comprises the steps of: immersing said device and an electrode in a plating bath which contains ions of the metal to be deposited; making electrical contact to said P-type first surface and to said electrode and applying a voltage therebetween, said P-type first surface being biased more negatively than said electrode; and illuminating said N-type second surface with a source of radiant energy.

10. The method of claim 9 wherein said source of radiant energy is a pulsed source.

11. The method of claim 9 wherein said source of radiant energy is a continuous source.

12. The method of claim 9 wherein said voltage is pulsed.

* * * * *